United States Patent
Rom et al.

(10) Patent No.: US 11,645,818 B2
(45) Date of Patent: *May 9, 2023

(54) VIRTUAL ITEM PLACEMENT SYSTEM

(71) Applicant: Houzz, Inc., Palo Alto, CA (US)

(72) Inventors: Shay Rom, Palo Alto, CA (US); Eli Konky, Tel Aviv (IL)

(73) Assignee: Houzz, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/228,802

(22) Filed: Apr. 13, 2021

(65) Prior Publication Data

US 2021/0233320 A1    Jul. 29, 2021

Related U.S. Application Data

(63) Continuation of application No. 16/567,518, filed on Sep. 11, 2019, now Pat. No. 11,004,270.

(Continued)

(51) Int. Cl.
| | |
|---|---|
| *G06T 19/00* | (2011.01) |
| *G06T 17/10* | (2006.01) |
| *G06F 3/01* | (2006.01) |
| *G06T 15/00* | (2011.01) |
| *G06F 30/20* | (2020.01) |
| *G06T 19/20* | (2011.01) |

(Continued)

(52) U.S. Cl.
CPC ............ *G06T 19/006* (2013.01); *G06F 3/017* (2013.01); *G06F 30/20* (2020.01); *G06T 15/005* (2013.01); *G06T 17/10* (2013.01); *G06F 3/011* (2013.01); *G06F 3/015* (2013.01); *G06F 3/0346* (2013.01); *G06F 30/13* (2020.01); *G06T 15/04* (2013.01); *G06T 19/20* (2013.01); *G06T 2210/04* (2013.01); *G06T 2215/16* (2013.01); *G06T 2219/2012* (2013.01)

(58) Field of Classification Search
CPC ..... G06T 19/006; G06T 15/005; G06T 17/10; G06T 15/04; G06T 19/20; G06T 2210/04; G06T 2215/16; G06T 2219/2012; G06F 3/017; G06F 30/20; G06F 3/011; G06F 3/015; G06F 3/0346; G06F 30/13

See application file for complete search history.

(56) References Cited

U.S. PATENT DOCUMENTS

| | | | |
|---|---|---|---|
| 9,389,315 B2 * | 7/2016 | Bruder | .................. G01S 7/4816 |
| 10,026,218 B1 | 7/2018 | Mertens et al. | |

(Continued)

OTHER PUBLICATIONS

"U.S. Appl. No. 16/567,518, Non Final Office Action dated Sep. 24, 2020", 17 pgs.

(Continued)

*Primary Examiner* — YuJang Tswei

(74) *Attorney, Agent, or Firm* — Schwegman Lundberg & Woessner, P.A.

(57) ABSTRACT

A virtual model placement system can generate virtual floors and virtual walls to correspond to a real-world environment. Virtual items such as doors, windows, lamps, can be placed on the generated virtual walls and the system can generate dynamic updates of the placed items in response to movement by a user's device (e.g., a smartphone moving from right to left). The virtual items can be initially placed as primitives and then rendered to new positions upon the user selecting a render or lock instruction.

20 Claims, 15 Drawing Sheets

Related U.S. Application Data

(60) Provisional application No. 62/729,930, filed on Sep. 11, 2018.

(51) Int. Cl.
  *G06T 15/04* (2011.01)
  *G06F 30/13* (2020.01)
  *G06F 3/0346* (2013.01)

(56) References Cited

U.S. PATENT DOCUMENTS

| | | | |
|---|---|---|---|
| 10,155,166 B1* | 12/2018 | Taylor | A63F 13/25 |
| 10,475,250 B1 | 11/2019 | Huang et al. | |
| 11,004,270 B2 | 5/2021 | Houzz | |
| 2012/0249741 A1* | 10/2012 | Maciocci | G06T 19/006 348/51 |
| 2015/0042640 A1* | 2/2015 | Algreatly | G06T 3/005 345/419 |
| 2017/0249745 A1* | 8/2017 | Fiala | A63F 13/65 |
| 2017/0287218 A1* | 10/2017 | Nuernberger | G06F 3/04845 |
| 2017/0352188 A1* | 12/2017 | Levitt | G06T 19/006 |
| 2018/0225885 A1* | 8/2018 | Dishno | G06T 19/20 |
| 2018/0315248 A1 | 11/2018 | Bastov et al. | |
| 2019/0051054 A1 | 2/2019 | Jovanovic et al. | |
| 2019/0197779 A1* | 6/2019 | Avramov | G06T 11/60 |
| 2019/0235729 A1* | 8/2019 | Day | G06F 3/012 |
| 2019/0362562 A1* | 11/2019 | Benson | G06V 10/82 |
| 2020/0082633 A1 | 3/2020 | Rom et al. | |
| 2020/0133000 A1* | 4/2020 | Amati | G06F 3/012 |
| 2020/0368616 A1 | 11/2020 | Delamont | |
| 2021/0027532 A1* | 1/2021 | Lin | G06V 20/176 |
| 2021/0233320 A1* | 7/2021 | Rom | G06F 3/017 |

OTHER PUBLICATIONS

"U.S. Appl. No. 16/567,518, Notice of Allowance dated Jan. 11, 2021", 10 pgs.

"U.S. Appl. No. 16/567,518, Response filed Dec. 18, 2020 to Non Final Office Action dated Sep. 24, 2020", 9 pgs.

* cited by examiner

VIRTUAL ITEM PLACEMENT SYSTEM

PRIORITY APPLICATIONS

This application is a continuation of U.S. patent application Ser. No. 16/567,518, filed Sep. 11, 2019, which application claims the benefit of priority to U.S. Provisional Application Ser. No. 62/729,930, filed Sep. 11, 2018, the contents of which are incorporated herein by reference in their entireties.

TECHNICAL FIELD

The present disclosure generally relates to special-purpose machines that manage data processing and improvements to such variants, and to the technologies by which such special-purpose machines become improved compared to other special-purpose machines for generating virtual item simulations.

BACKGROUND

Increasingly, users would like to simulate an object (e.g., chair, door, lamp) in a physical room without having access to the object. For example, a user may be browsing a web store and see a floor lamp that may or may not match the style of the user's living room. The user may take a picture of his living room and overlay an image of the floor lamp in the picture to simulate what the floor lamp would look like in the living room. However, it can be difficult to adjust the floor lamp within the modeling environment using a mobile client device, which has limited resources (e.g., a small screen, limited processing power).

BRIEF DESCRIPTION OF THE DRAWINGS

To easily identify the discussion of any particular element or act, the most significant digit or digits in a reference number refer to the figure ("FIG.") number in which that element or act is first introduced.

DETAILED DESCRIPTION

Figure 1:
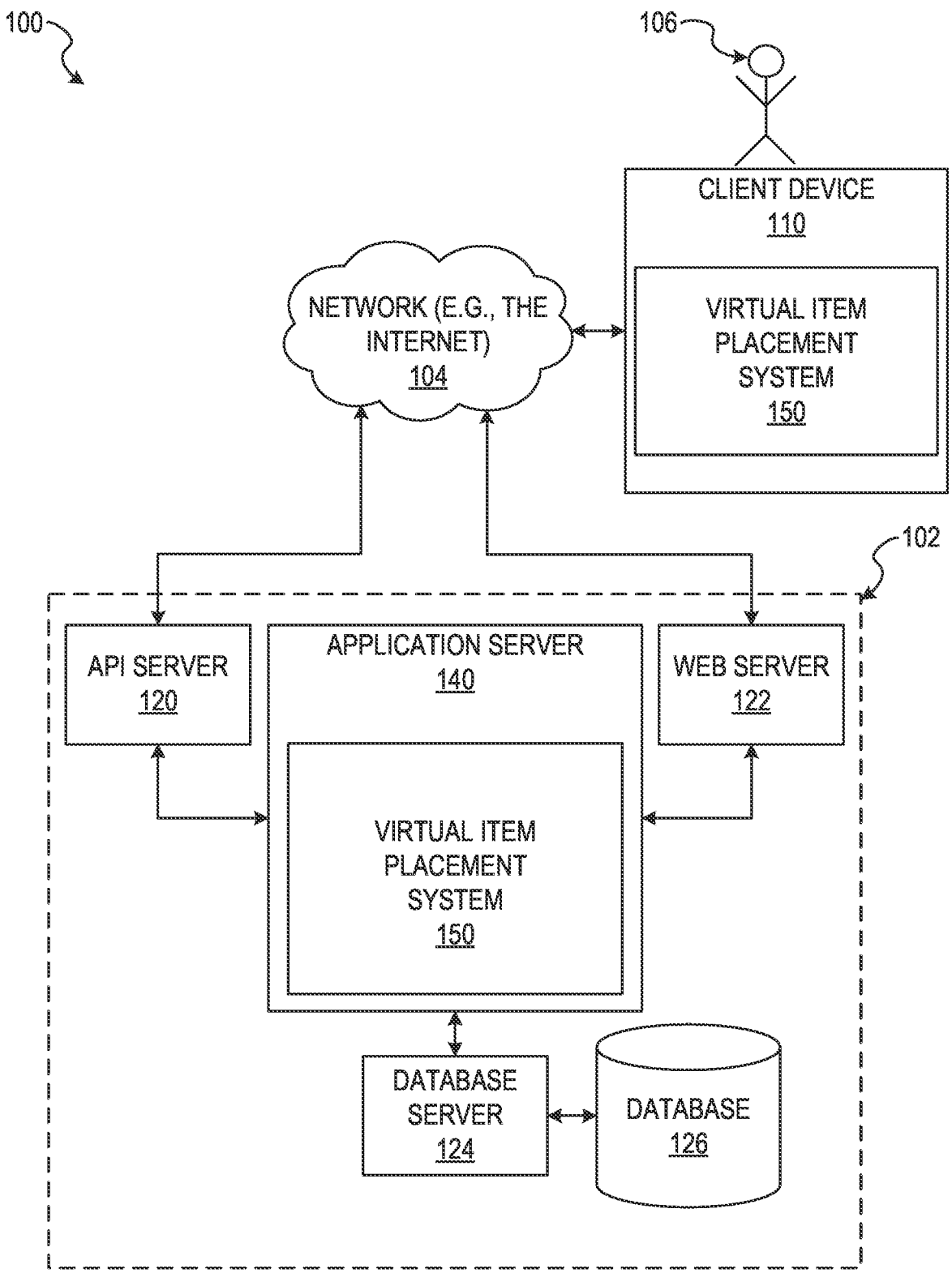
FIG. 1 is a block diagram shown an example network architecture in which embodiments of the virtual item placement system can be implemented, according to some example embodiments.

The description that follows includes systems, methods, techniques, instruction sequences, and computing machine program products that embody illustrative embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

As discussed, it can be difficult to simulate items on mobile devices due to their finite or limited resources (e.g., low processor power, low memory as compared to desk top rendering stations, small screen size lack of input/output controls). One type of difficulty includes simulation of items or textures (e.g., wallpaper) on vertical walls because whereas floors have image features that can be detected, often walls are uniform surfaces with little to no image features that can be used to generate and align a virtual vertical wall upon which vertical items can be placed and rendered. To this end, a virtual item placement system can generate virtual floors, and virtual walls that intersect with the floors based on user inputs. For example, the user can input points onto a detected floor surface, and a vertical wall can be created as a vertical plane that is orthogonal (e.g., at 90 degrees) to the floor surface. The vertical wall can be created in this way with two constraints: the wall is aligned with the point placements and further constrained by orthogonality to the floor. Virtual items can then be modeled on the virtual wall, where the virtual wall is kept transparent and the virtual items are rendered on the virtual wall so at they appear as if they are applied directly to a real-world wall. In some example embodiments, to conserve mobile device resources, lightweight primitives of the virtual items to be placed are used instead of full texture 3-D models of the items. The primitives can include simple geometric shape with a lightweight uniform texture (e.g., one color), a mesh of the model, or a collection of vertices connected by lines that outline the shape of the virtual model. In some example embodiments, the placed primitives are anchored or otherwise constrained with the generated virtual wall to enable rapid and accurate placement of the item to be modeled. For example, a door primitive can be anchored at the bottom side of the virtual wall and slide along the wall in response to client device movement (e.g., a user moving a client device from right to left as detected by inertial sensors of the client device, such as an accelerometer and gyroscope). In some example embodiments, the user can select a lock element (e.g., button) that locks the item primitive in place and the system generates a full render of the object with realistic textures and lighting (e.g., an Oak door with a wood texture with virtual rays reflected off the wood texture, as calculated by graphical processing unit shaders on the client device). In this way, resource limited mobile devices can simulate virtual items on surfaces of a real-world room, such as a bedroom wall.

Further, in some example embodiments, the system can lock primitive sub-components to other primitive sub-components to enable the user to more readily manipulate a complex primitive model (e.g., a table) on user's mobile device. For example, leg primitives can be anchored to a table surface primitive, which can then be modified or snapped to a vertical wall as viewed through the mobile device. In this way, the user can rapidly generate models of complex 3-D models that conventionally would be modeled using higher power computational devices (e.g., a desktop workstation with a high-powered CPU and one or more dedicated graphics cards).

With reference to FIG. 1, an example embodiment of a high-level client-server-based network architecture 100 is shown. A networked system 102, in the example forms of a network-based rendering platform that can provide server-side rendering via a network 104 (e.g., the Internet or wide area network (WAN)) to one or more client devices 110. In some implementations, a user (e.g., user 106) interacts with the networked system 102 using the client device 110. The client device 110 may execute the system 150 as a local application or a cloud-based application (e.g., through an Internet browser).

In various implementations, the client device 110 comprises a computing device that includes at least a display and communication capabilities that provide access to the networked system 102 via the network 104. The client device 110 comprises, but is not limited to, a remote device, work station, computer, general purpose computer, Internet appliance, hand-held device, wireless device, portable device, wearable computer, cellular or mobile phone, personal digital assistant (PDA), smart phone, tablet, ultrabook, netbook, laptop, desktop, multi-processor system, microprocessor-based or programmable consumer electronic, game consoles, set-top box, network personal computer (PC), mini-computer, and so forth. In an example embodiment, the client device 110 comprises one or more of a touch screen, accelerometer, gyroscope, biometric sensor, camera, microphone, Global Positioning System (GPS) device, and the like. In some embodiments, the client device 110 is the recording device that generates the video recording and also the playback device that plays the modified video recording during a playback mode. In some embodiments, the recording device is a different client device than the playback device, and both have instances of the virtual item placement system 150 installed. For example, a first client device using a first instance of a dynamic virtual room modeler may generate a simulation, and a second client device using a second instance of a dynamic virtual room modeler may receive the simulation over a network and display the simulation via a display screen. The instances may be platform specific to the operating system or device in which they are installed. For example, the first instance may be an iOS application and the second instance may be an Android application.

The client device 110 communicates with the network 104 via a wired or wireless connection. For example, one or more portions of the network 104 comprises an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the public switched telephone network (PSTN), a cellular telephone network, a wireless network, a Wireless Fidelity (WI-FI®) network, a Worldwide Interoperability for Microwave Access (WiMax) network, another type of network, or any suitable combination thereof.

Users (e.g., the user 106) comprise a person, a machine, or other means of interacting with the client device 110. In some example embodiments, the user 106 is not part of the network architecture 100, but interacts with the network architecture 100 via the client device 110 or another means. For instance, the user 106 provides input (e.g., touch screen input or alphanumeric input) to the client device 110 and the input is communicated to the networked system 102 via the network 104. In this instance, the networked system 102, in response to receiving the input from the user 106, communicates information to the client device 110 via the network. 104 to be presented to the user 106. In this way, the user 106 can interact with the networked system 102 using the client device 110.

The API server 120 and the web server 122 are coupled to, and provide programmatic and web interfaces respectively to, one or more application server 140. The application server 140 can host a dynamic virtual environment modeler server 151, which can comprise one or more modules or applications and each of which can be embodied as hardware, software, firmware, or any combination thereof. The application server 140 is, in turn, shown to be coupled to a database server 124 that facilitates access to one or more information storage repositories, such as database 126. In an example embodiment, the database 126 comprises one or more storage devices that store information to be accessed by the virtual item placement system 150. Additionally, in some embodiments, the model data may be cached locally on the client device 110. Further, while the client-server-based network architecture 100 shown in FIG. 1 employs a client-server architecture, the present inventive subject matter is, of course, not limited to such an architecture, and can equally well find application in a distributed, or peer-to-peer, architecture system, for example.

Figure 2:
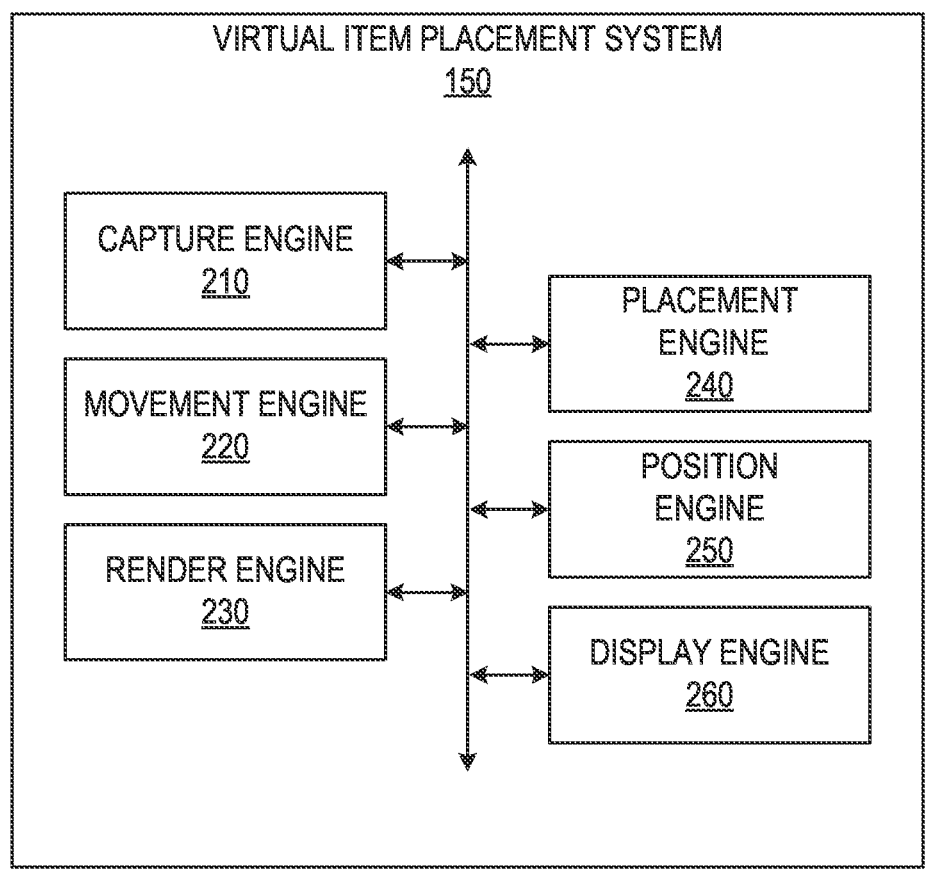
FIG. 2 illustrates example functional engines of a virtual item placement system, according to some example embodiments.

FIG. 2 illustrates example functional engines of a virtual item placement system 150, according to some example embodiments. As illustrated, the virtual item placement system 150 comprises a capture engine 210, a movement engine 220, a render engine 230, a placement engine 240, a position engine 250, and the display engine 260. The capture engine 210 manages capturing one or more images, such as an image or an image sequence (e.g., a video, live video displayed in real-time on a mobile device). The movement engine 220 is configured to implement one or more inertial sensors (e.g. gyroscope, accelerometer) to detect movement of a user device (e.g., a client device, a mobile device, a smartphone) that is executing an instance of the virtual item placement system 150, according to some example embodiments. The render engine 230 is configured to generate and manage a 3-D modeling environment in which virtual items can be placed and rendered for output on a display (e.g., overlaid on top of images generated by the capture engine 210 to provide an augmented reality experience for the viewer of the user device). The placement engine 240 is configured to receive point placements from a user of the client device. The point placements can be used to construct virtual items in the virtual item environment by the render engine 230. For example, the placement engine 240 can receive placements of corners of the physical environment for use in generating a 3-D model of the environment (e.g., virtual walls of the environment).

In some example embodiments, the placement engine 240 is configured to detect a ground surface of the physical environment being depicted in the image(s) captured by the capture engine 210. For example, the placement engine 240 can detect image features of a physical ground depicted in the images, determine that the image features are trackable across images of the live video (e.g., using scale invariant feature transform, SIFT), and determine or assume that the detected image features are coplanar, and thusly determine an orientation of real-world ground surface depicted in the images. The position engine 250 is configured to manage positional updates of a virtual item in the 3-D modeling environment. For example, the position engine 250 can move a virtual door geometric primitive along a virtual wall in response to physical movement detected by the movement engine 220, as discussed in further detail below. The display engine 206 is configured to generate a user interface to display images (e.g., a live video view), receive user inputs (e.g. user input of points), receive manipulations of the virtual item, and render a composite augmented reality display that dynamically updates the virtual item to simulate that the virtual item actually exist in the depicted environment of the images generated by the capture engine 210.

Figure 3:
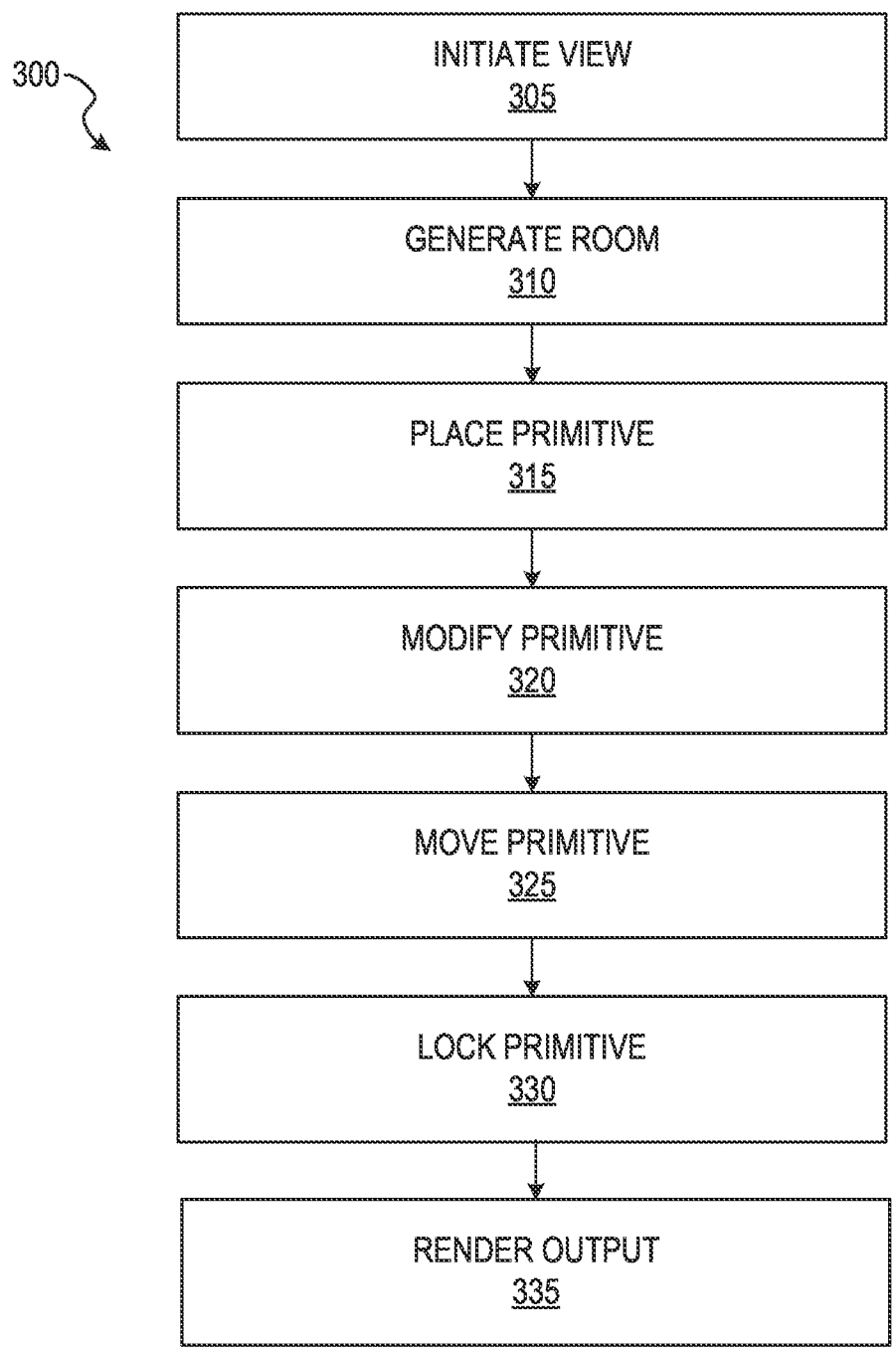
FIG. 3 shows an example flow diagram for placement and simulation of virtual items, according to some example embodiments.

FIG. 3 shows a flow diagram of an example method. 300 for implementing virtual item placement, according to some example embodiments. At operation 305, the capture engine 210 initiates a view on the client device. For example, at operation 305, the capture engine 210 generates a live video view using an image sensor on a backside of a client device.

At operation 310, the render engine 230 generates a 3-D model of a room environment. For example, the placement engine 240 can first detect a ground surface using image feature analysis as discussed above, and then generate a virtual horizontal plane in the 3-D model of the room environment to correspond to the detected real-world ground. Further, the placement engine 240 can receive placements of points that indicate one or more physical walls. The point placements can be used to construct virtual walls as vertical planes in the 3-D modeling environment, as discussed in further detail below.

At operation 315, the position engine 250 places a primitive in the 3-D modeling environment according to placements instructions received on the client device. For example, the user of the client device can drag-and-drop a door image onto the live view video. In response to dragging and dropping the door image onto the live view, the placement engine 240 places a door primitive on the virtual wall that coincides with the physical wall onto which the user drag-and-dropped the door image.

At operation 320, the placement engine 240 receives one or more manipulations or modifications to the primitive. For example, at operation 320, the placement engine 240 receives an instruction to scale the size of the door by receiving a drag gesture on the door depicted on the client device. Responsive to the gesture, the placement engine 240 scales the size of the door so that it is larger or smaller in response to the user's gestures.

At operation 325, the primitive is moved in response to the client device movement. For example, at operation 325, the movement engine 220 detects physical movement of the client device using one or more inertial sensors, such as a gyroscope or accelerometer that are integrated into the client device. In some example embodiments, the movement is detected using image analysis (e.g., detect movement of wall image features between different frames of the video sequence, as in a SIFT algorithm). In response to the movement detected using image analysis or inertial sensors, the virtual item is moved in the environment. For example, in response to the user rotating the client device counterclockwise (e.g., sweeping the client device from the user's right to the user's left), the virtual item slides along a virtual wall in the leftward direction with the virtual item locked at the bottom of the wall, according to some example embodiments. In some example embodiments, in addition to movement of the primitive in the 3-D environment, a virtual camera using to render the 3-D environment is moved so that the perspective of the imaged physical environment matches the perspective of the 3-D model environment rendered by the virtual camera.

At operation 330, the position engine 250 receives a lock instruction to save the placed primitive at the current location. For example, after the user finishes rotating the client device counterclockwise and the door slides in the leftward direction, the user can select a save instruction to save the coordinates of the virtual item at the current position on the virtual wall.

At operation 335, the render engine 230 renders an augmented display of the virtual item and the physical environment depicted in the one or more images (e.g. the live video generated at operation 305). In some example embodiments, the method 300 is performed continuously so that in response to new physical movements of the client device, the virtual item is moved a corresponding amount, the virtual camera is likewise moved a corresponding amount, and a new augmented reality frame is displayed on a display device of the client device, thereby enabling a user viewing the client device to simulate the placed virtual item in the physical environment as viewed through the client device.

Figure 4:
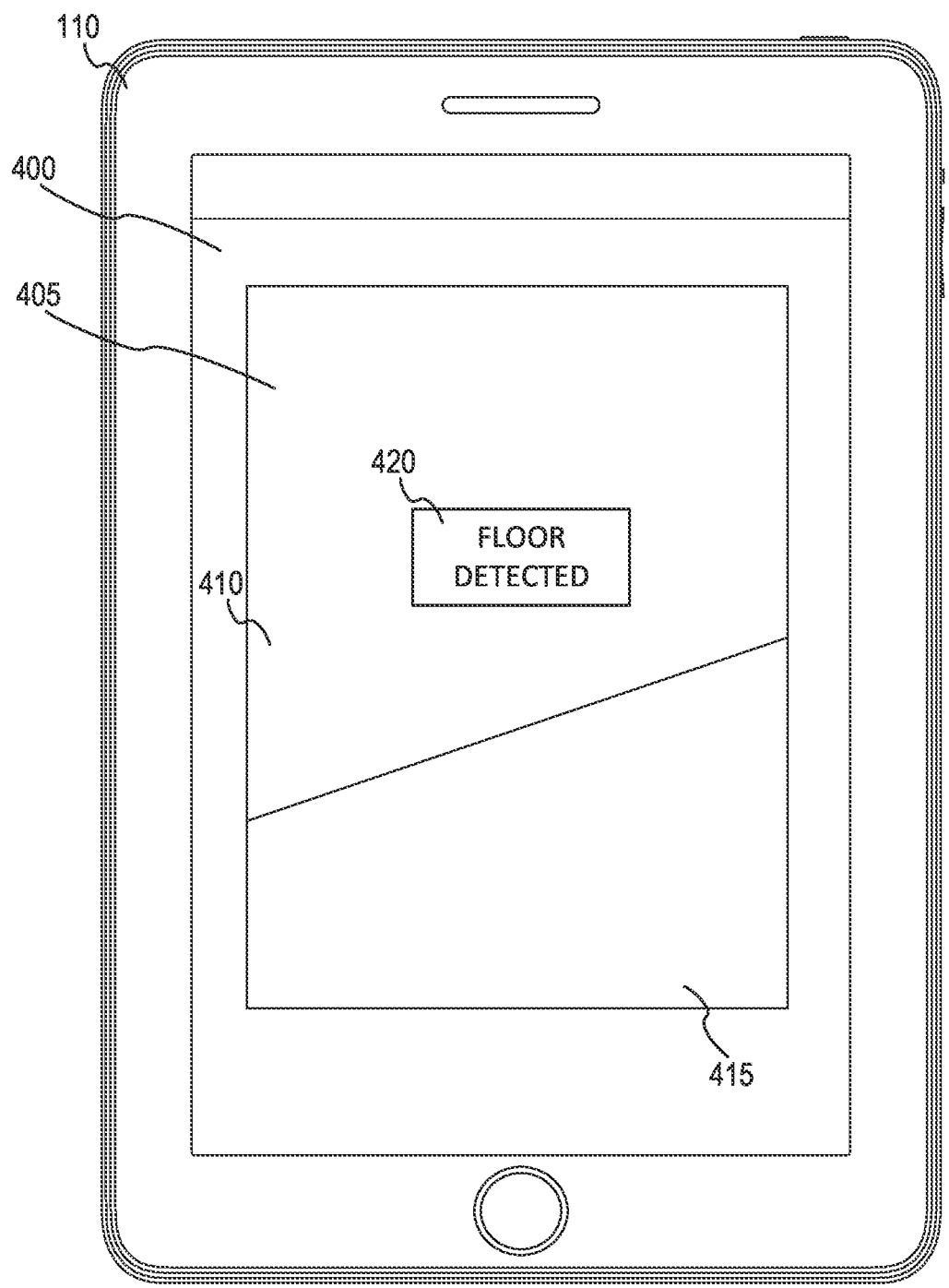
FIG. 4 shows an example user interface displaying live video for virtual item placement, according to some example embodiments.

FIG. 4 shows an example user interface for implementing virtual item placement, according to some example embodiments. In FIG. 4, a client device 110 displays a user interface 400 in which an image 405 (e.g., a frame of a live video generated by a backside camera on the client device 110) of the physical room is depicted. The physical room includes a first wall 410 and a floor 415. As illustrated, the system 150 has detected the floor 415 using image feature analysis and a notification 420 is displayed on the user interface 400 to indicate that the floor 415 has been detected.

Figure 5:
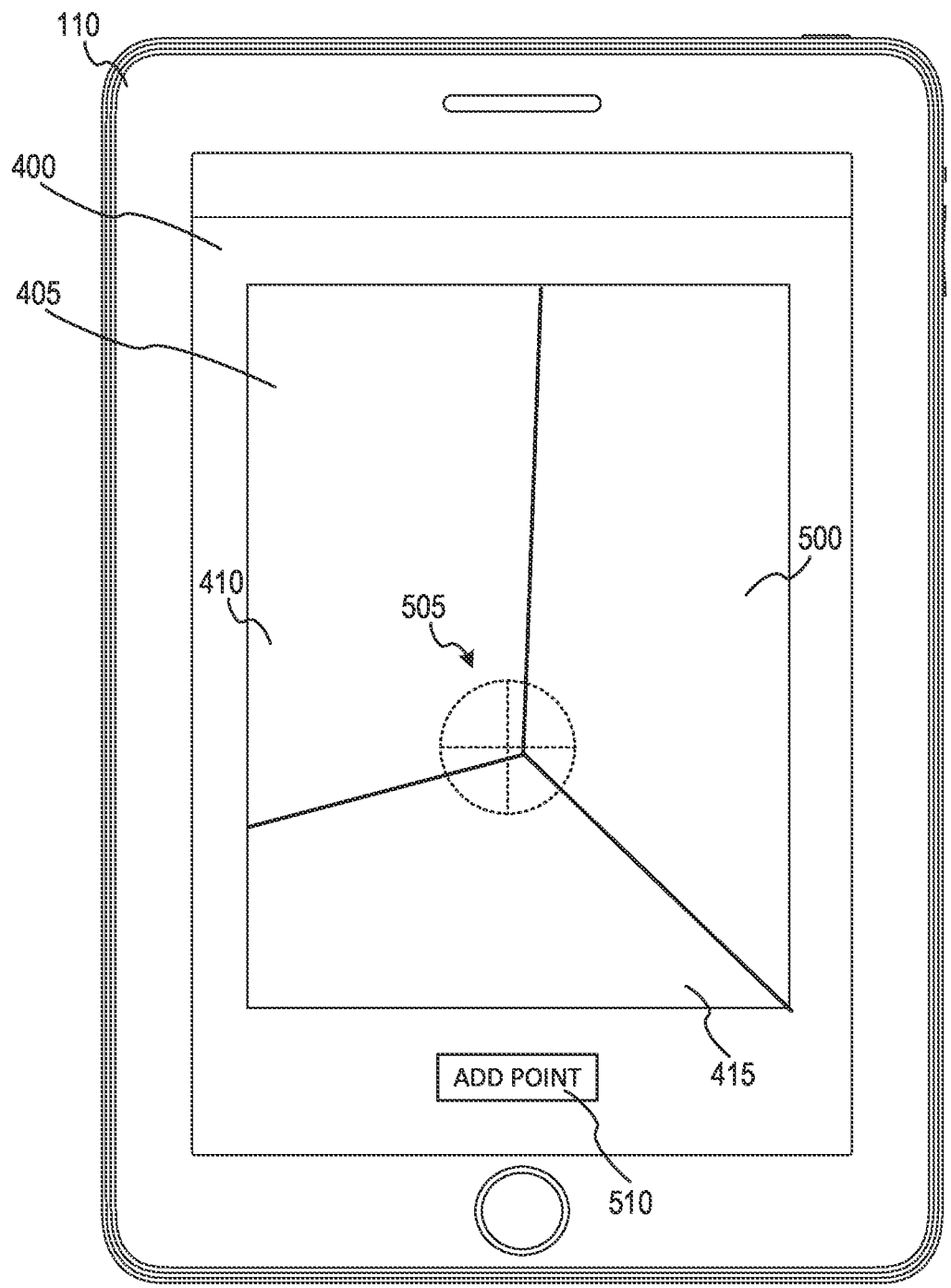
FIG. 5 shows an example user interface including a guide for adding points, according to some example embodiments.

FIG. 5 shows an example user interface including a guide for adding points, according to some example embodiments. In FIG. 5, the user (not depicted) has moved the client device 110 so that the image now depicts the first wall 410 the floor 415 and a second wall 500 that intersect at a corner. The user interface 400 includes a guide 505, which is displayed as a reticule that the user can position over the corner of the room and select the add point button 510.

Figure 6:
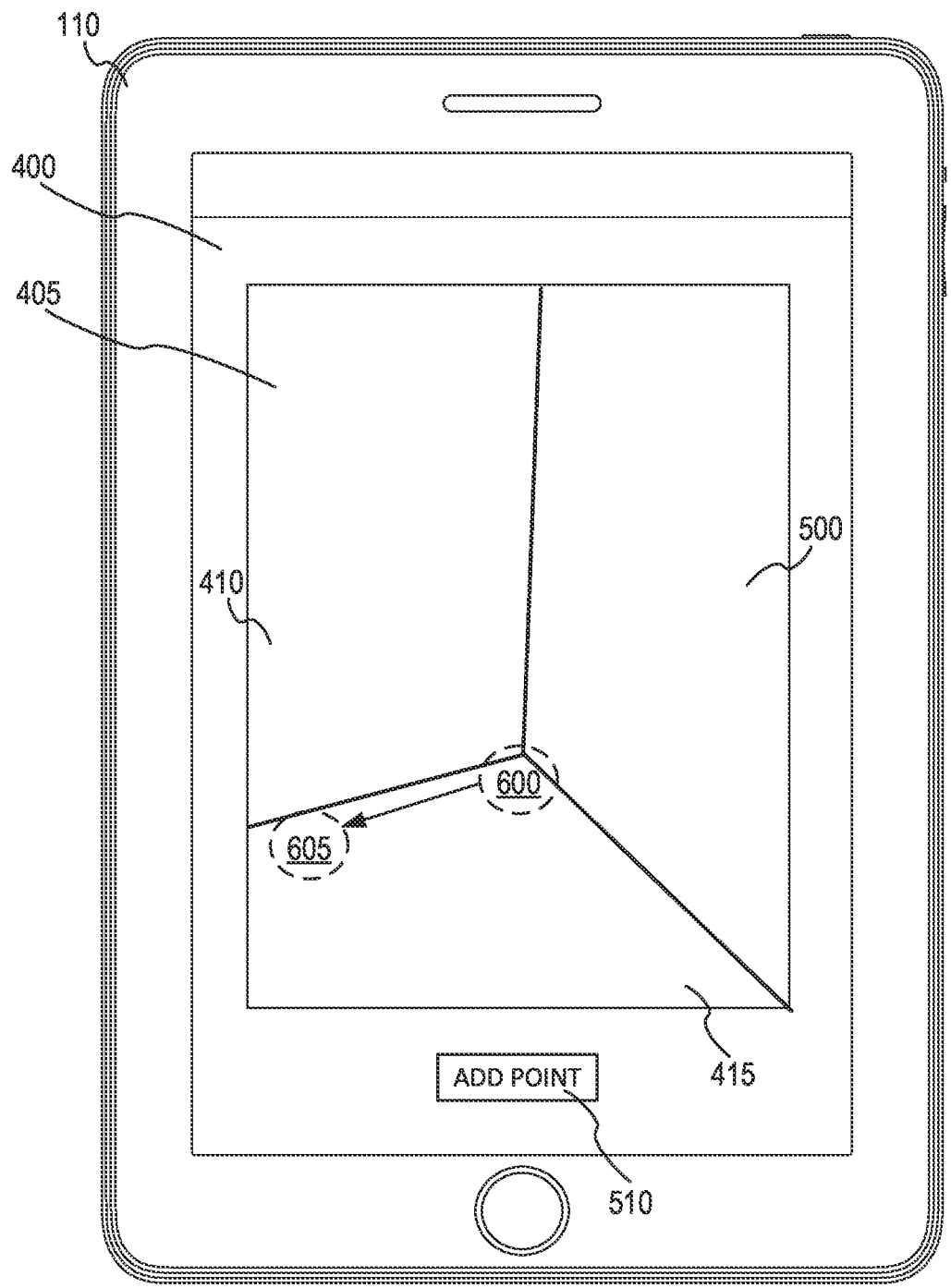
FIG. 6 shows an example user interface for implementing virtual item placement, according to some example embodiments

Moving to FIG. 6, after the user adds the point 600, the user moves the client device 110 counterclockwise which creates a guideline (e.g., the arrow) extending from the point 600. The guideline coincides with the interface or corner of the first wall 410 and the floor 415 (although, in the example illustrated in FIG. 6, the guideline is shown off set from the corner of the first wall 410 and the floor 415). In some example embodiments, the user moves the client device 110 so that the reticule (guide 505) is over each point (e.g., corner) of the room, after which the user selects the add point button 510 so that each corner of the room can be received, and virtual walls generated for the 3-D virtual environment.

In some example embodiments, the user only defines a single wall upon which virtual items are simulated. For example, the user can place point 600 then drag the guide counterclockwise and add point 605 to create a line between the points 605 and 600. The line is then used to demarcate a virtual wall upon a virtual ground (e.g., a virtual ground in the 3-D model of the room), where the virtual wall is set as a vertical plane that orthogonally intersects the virtual ground (e.g., at 90 degrees). The user can then place virtual items on the virtual wall, and it will appear as if the virtual items are on the physical vertical wall as discussed in further detail below.

Figure 7:
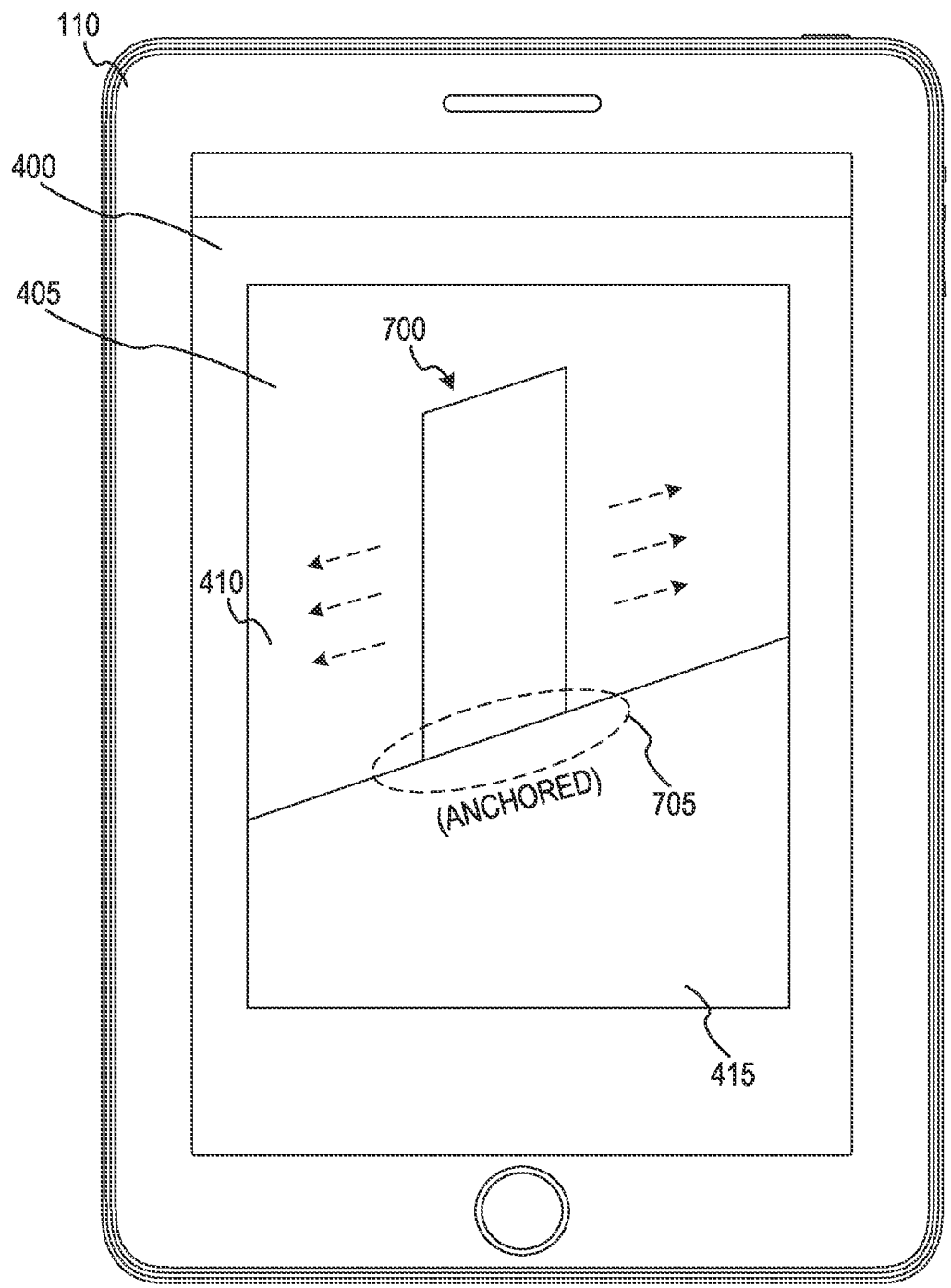
FIG. 7 shows an example user interface for implementing virtual item placement, according to some example embodiments.

FIG. 7 shows an example user interface for implementing virtual item placement, according to some example embodiments. In FIG. 7, the user has placed a virtual door 700 (e.g., virtual door primitive) by dragging and dropping the virtual door 700 anywhere onto the image 405. Although primitives (e.g., wireframe, collection of vertices), are discussed here as an example, in some example embodiments, the virtual items are displayed as full textured virtual items (e.g., a door with an Oak wood virtual texture). Continuation, in response to receiving the drag-and-drop instruction, the virtual item placement system 150 snaps the virtual door 700 on the first wall 410 (e.g., on the virtual wall constructed in FIG. 6) such that the bottom side of the virtual door 700 is anchored 705 to the intersection or corner of the first wall 410 in the floor 415. In some example embodiments, the edge of the virtual door is anchored to the edge or end of the vertical wall in the 3-D modeling environment managed the render engine 230. In some example embodiments, the virtual door is anchored to the intersection of the virtual ground and the virtual wall. For example, the virtual wall can be generated as an infinite vertical plane and the ground is generated as an infinite horizontal plane, and the intersection of the places is a line to which the bottom edge of virtual door is locked, such that the virtual door 700 slides along the intersection line as displayed in FIGS. 8 and 9.

Figure 8:
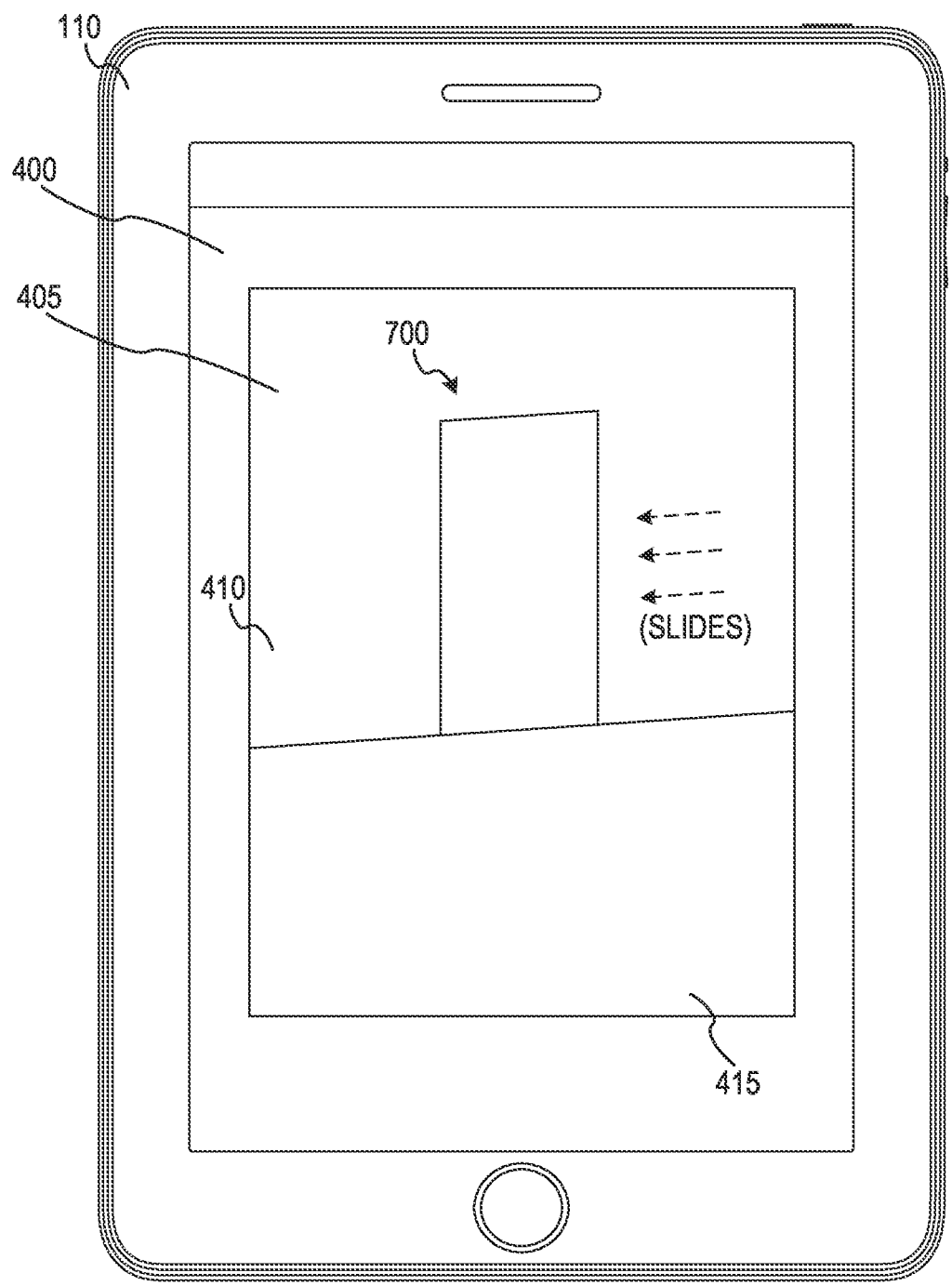
FIG. 8 shows an example user interface for updating virtual item placements, according to some example embodiments.
Figure 9A:
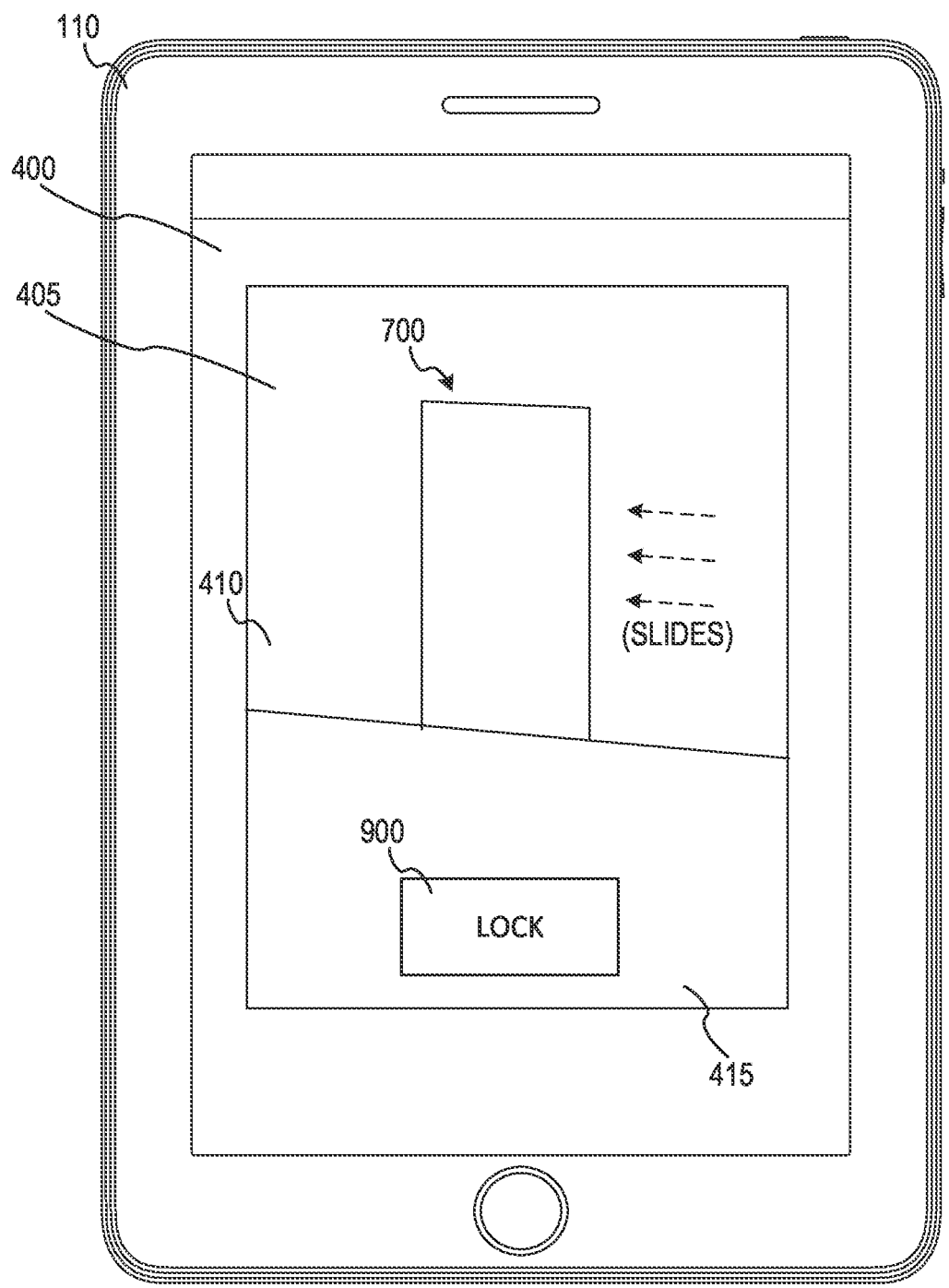
FIGS. 9A and 9B show example user interface for locking and rendering a virtual item, according to some example embodiments.
Figure 9B:
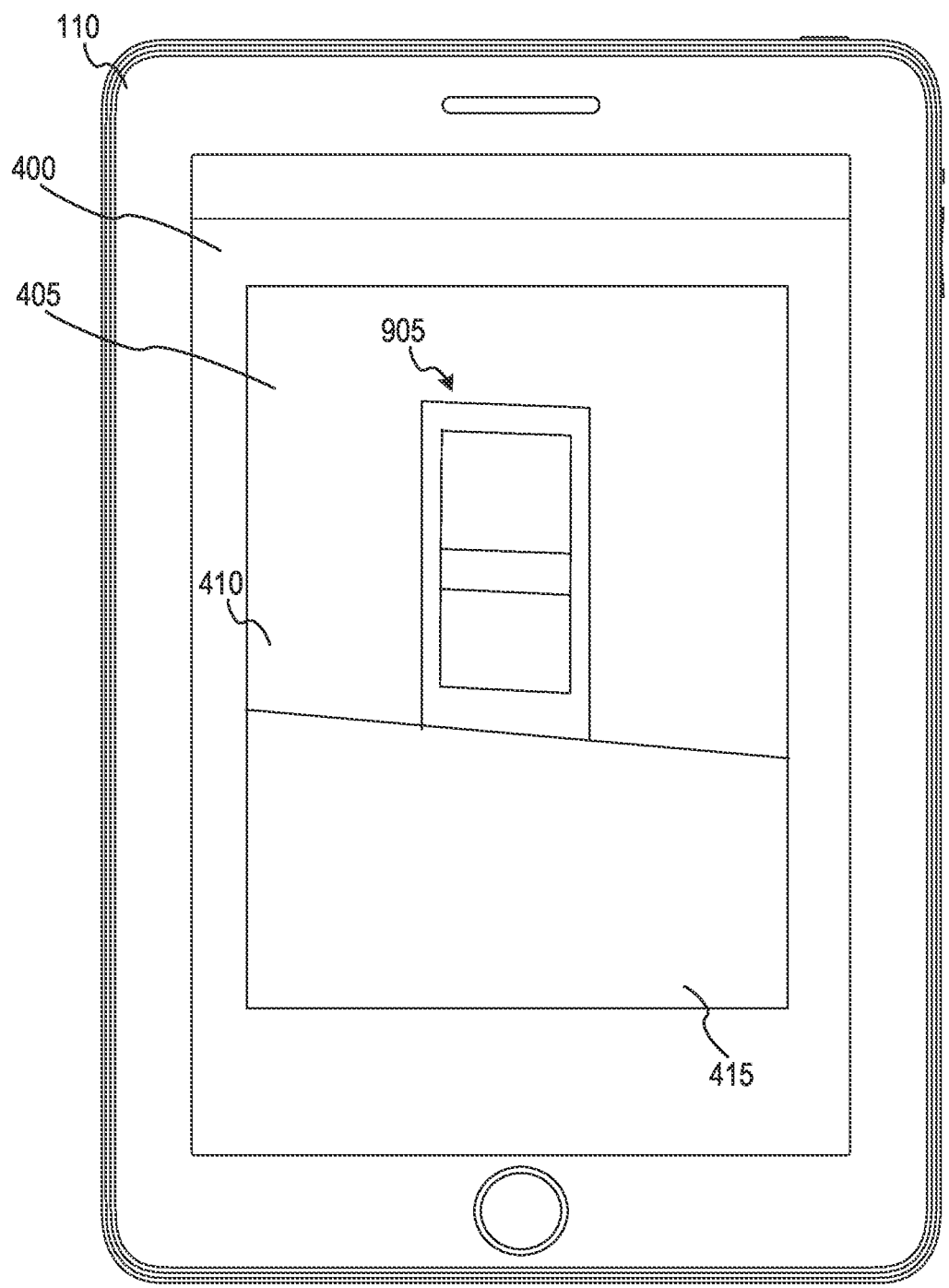

FIG. 8 shows an example user interface for updating virtual item placement, according to some example embodiments. In FIG. 8, the client device 110 has been rotated counterclockwise. Responsive to the counterclockwise rotation, the virtual door 700 is moved along the first wall 410 by sliding the virtual door 700 such that the bottom side of the door coincides with the corner of the first wall 410 in the floor 415, FIG. 9A shows a further update to the user interface 400 in response to the client device 110 being further rotated counterclockwise. As displayed in FIG. 9, in response to further rotation (as detected by inertial sensor analysis or image feature analysis) the virtual door 700 is moved further to the left on the first wall 410. Further, if two walls are defined (e.g., via point placements), when the client device 110 rotates to view the other real-world wall, the virtual door 700 snaps from the first virtual wall to the second virtual wall that is aligned with the second real world wall of the room. In this way, the user of the client device 110 can more easily place and model the door at different places of the depicted virtual room. That is, the anchoring to the virtual wall allows the user to efficiently place virtual wall items (e.g., doors, windows) within the simulation environment on the client device, which has limited input/output controls and limited screen size. For example, whereas in conventional approaches, the user may manually align the door using mouse clicks or dragging the door to align with the wall; in the example embodiment of FIG. 7 the anchoring allows the user of the client device 110 to efficiently place and move the virtual door 700 in the augmented reality display. The user may further select a lock button 900 which then locks the virtual door at the new position on the virtual wall. In some example embodiments, the virtual door is initially displayed as a lightweight primitive e.g., mesh, door outline) that slides along the real-world wall (via the primitive being constrained to a transparent virtual wall). Continuing to FIG. 9B, in response to the lock button 900 being selected, the render engine 230 then renders the door as a realistic virtual item 905, with image textures and virtual light rays reflected off the door, to accurately create an augmented reality simulation of the door on the real-world wall, as viewed through the client device 110.

Figure 10:
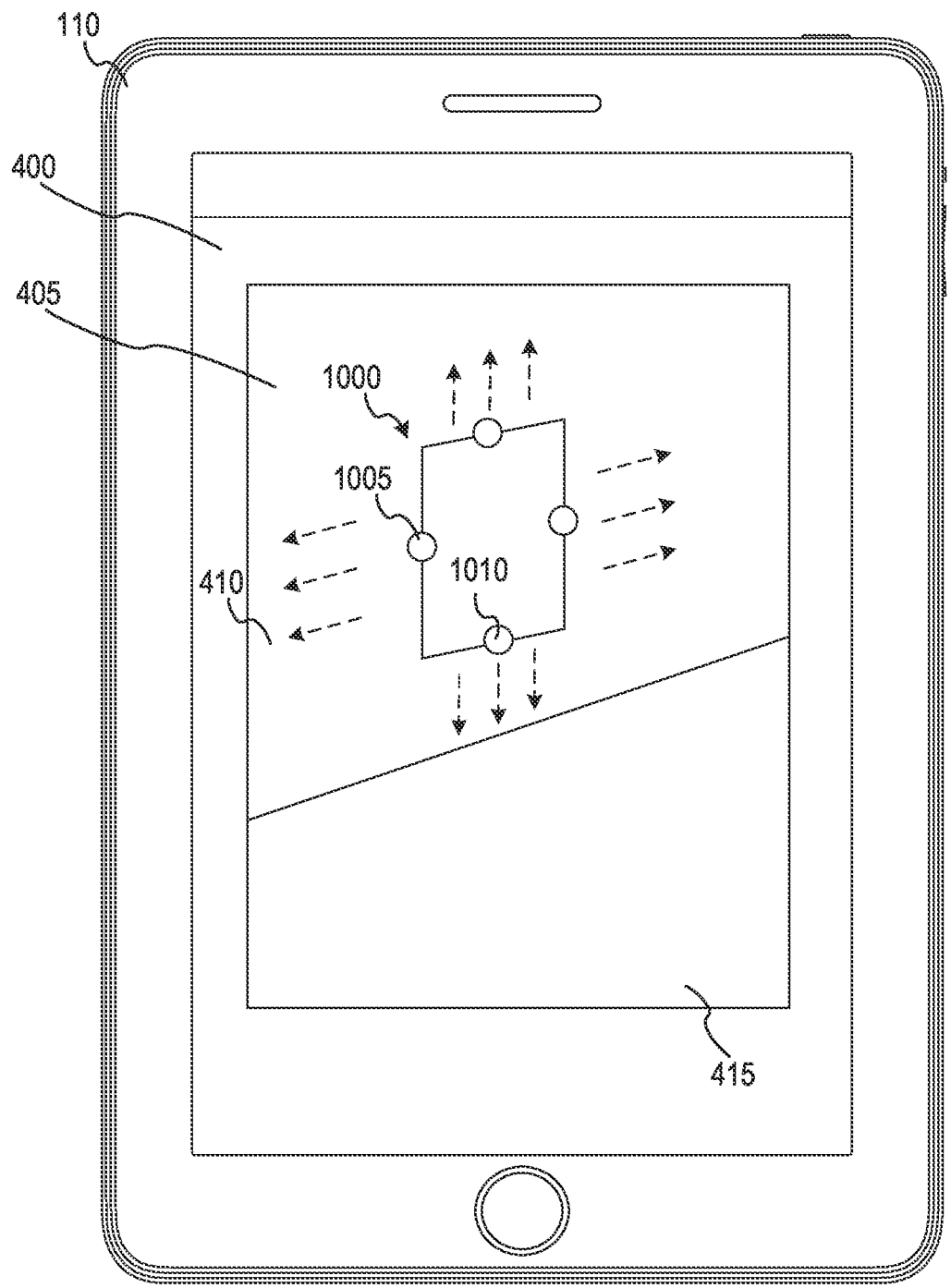
FIG. 10 shows an example user interface for implementing unconstrained virtual item placement, according to some example embodiments.

FIG. 10 shows an example user interface for implementing a virtual item placement in which the virtual item is unconstrained, according to some example embodiments. As illustrated in FIG. 10, instead of placing a virtual door, the virtual item placed is a window, such as virtual window 1000. In contrast to a virtual door which was anchored to the wall's bottom side, the virtual window 1000 can be moved up and down along the vertical dimension (a first degree of freedom), and left and right along a horizontal dimension (a second degree of freedom). Further, according to some example embodiments, the virtual item place can be modified. For example, a user of the client device 110 can perform a drag gesture over element 1005 to increase or decrease the width of the virtual window 1000. Likewise, user of the client device 110 can perform a drag gesture over element 1010 to increase or decrease the height of the virtual window 1000.

Figure 11A:
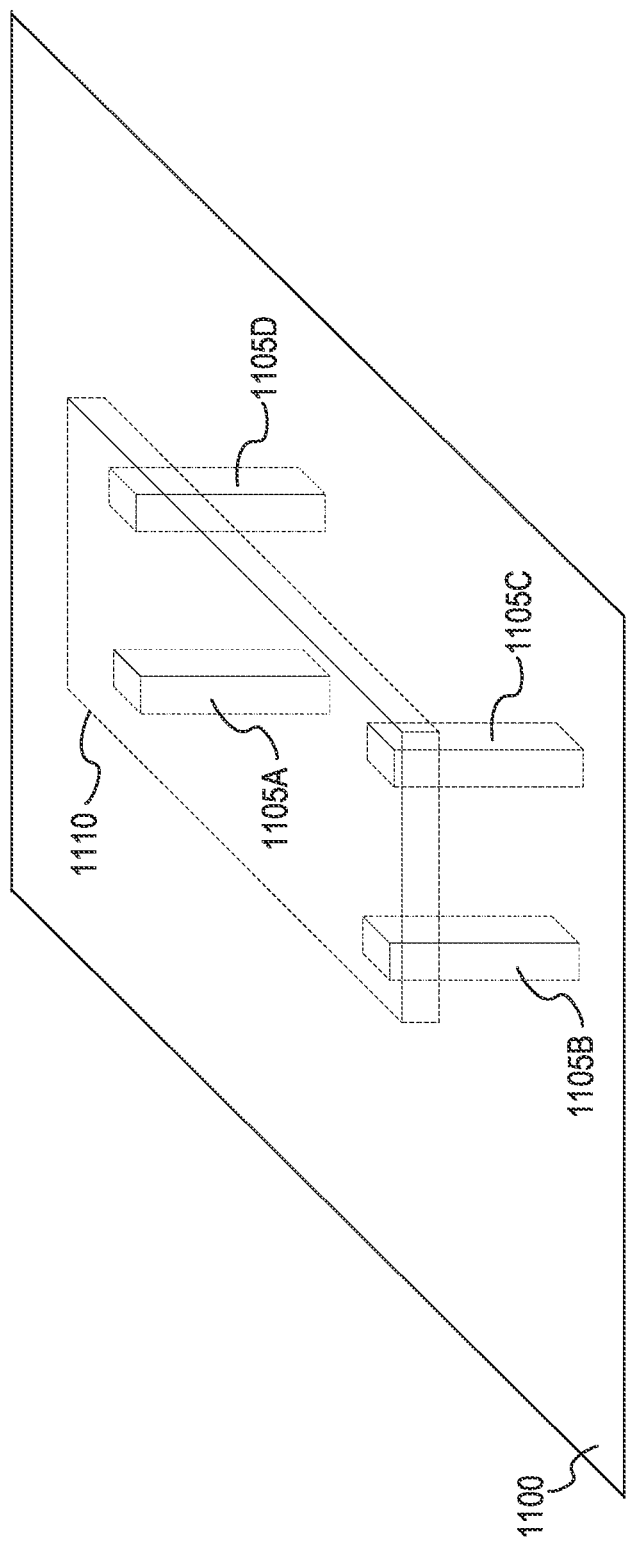
FIGS. 11A and 11B show example virtual item anchors and groupings, according to some example embodiments.
Figure 11B:
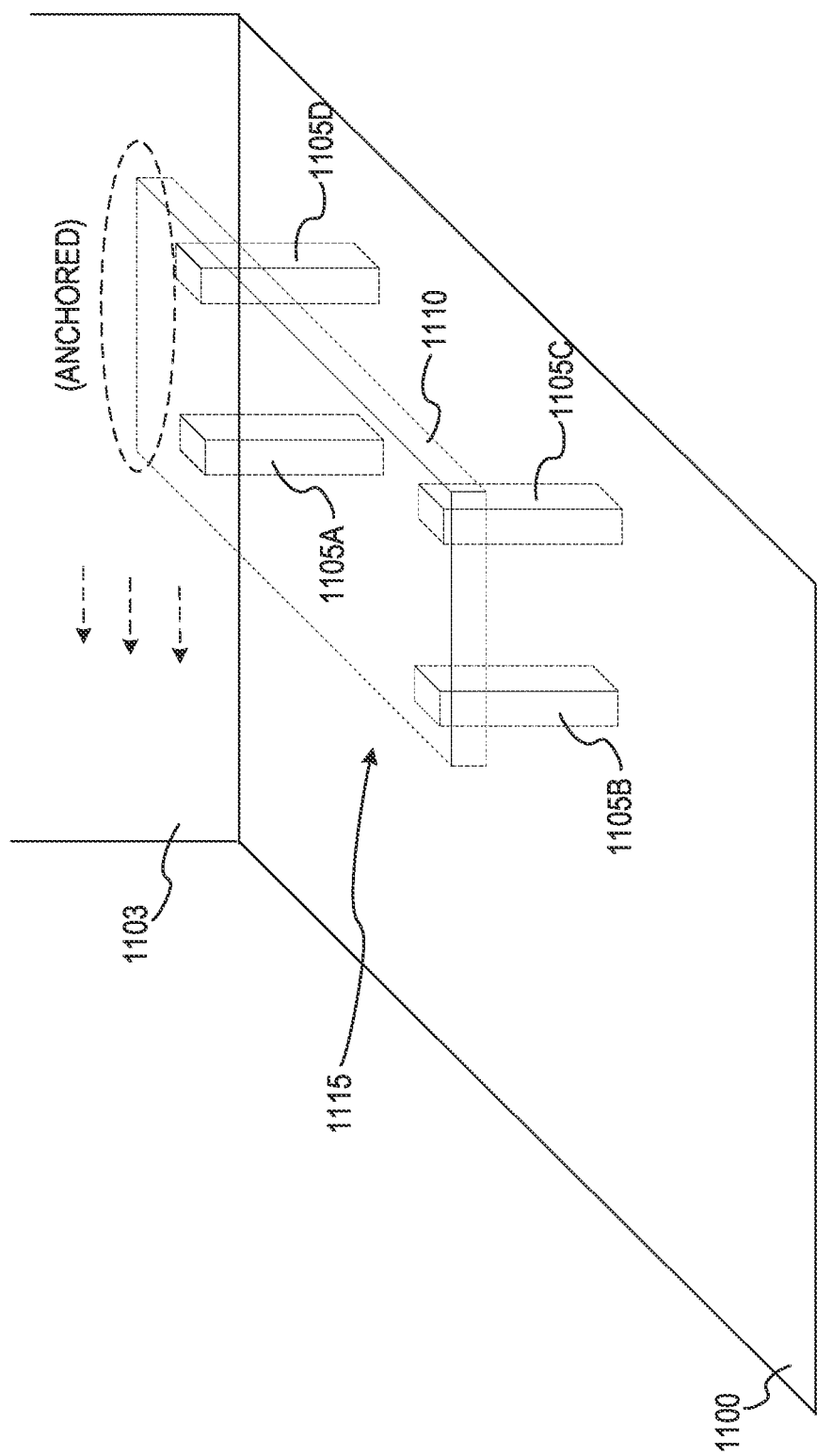

Although in the above examples, two-dimensional virtual items are placed. (e.g., a virtual door, a virtual window), in some example embodiments the virtual items placed using the above approaches are three-dimensional. For example, with reference to FIG. 11, a virtual table can be placed in the augmented reality environment by placing four separate cylinder primitives 1105A-D on a surface ground. 1100 (e.g., dragging shapes onto an image depicting the physical ground, where the surface ground is a virtual horizontal plane). The separate cylinder primitives 1105A-D correspond to four legs of a table to be modeled. Further, a virtual rectangle 1110 can be snapped to the four cylinder primitives 1105A-D to rapidly delineate an approximate space in which a virtual table is to be modeled. In some example embodiments, the placed primitives can be locked into groups so that in response to client device movement the group of primitives move around the 3-D modeling environment as a unit. For example, with reference to FIG. 11B, one side of the table group 1115 can be locked to virtual wall 1103, and when the client device is moved counter clockwise the table group 1115 slides left while being anchored to the wall (e.g., the side of the virtual rectangle 1110 is anchored or constrained to the virtual wall 1103).

In some example embodiments, the placed primitives are locked or constrained in relation to each other. For example, the bottom side of the virtual rectangle 1110 can be locked to the top surface of the four cylinder primitives 1105A-D, and in response to client device movement, the virtual rectangle 1110 can slide on top of the cylinder primitives 1105A-D but not be separated from the cylinder primitives 1105A-D. In this way, a user of the virtual item placement system 150 can pre-grouped and pre-locked primitives to efficiently model complex objects, such as tables, chairs, lamps, in a room.

Figure 12:
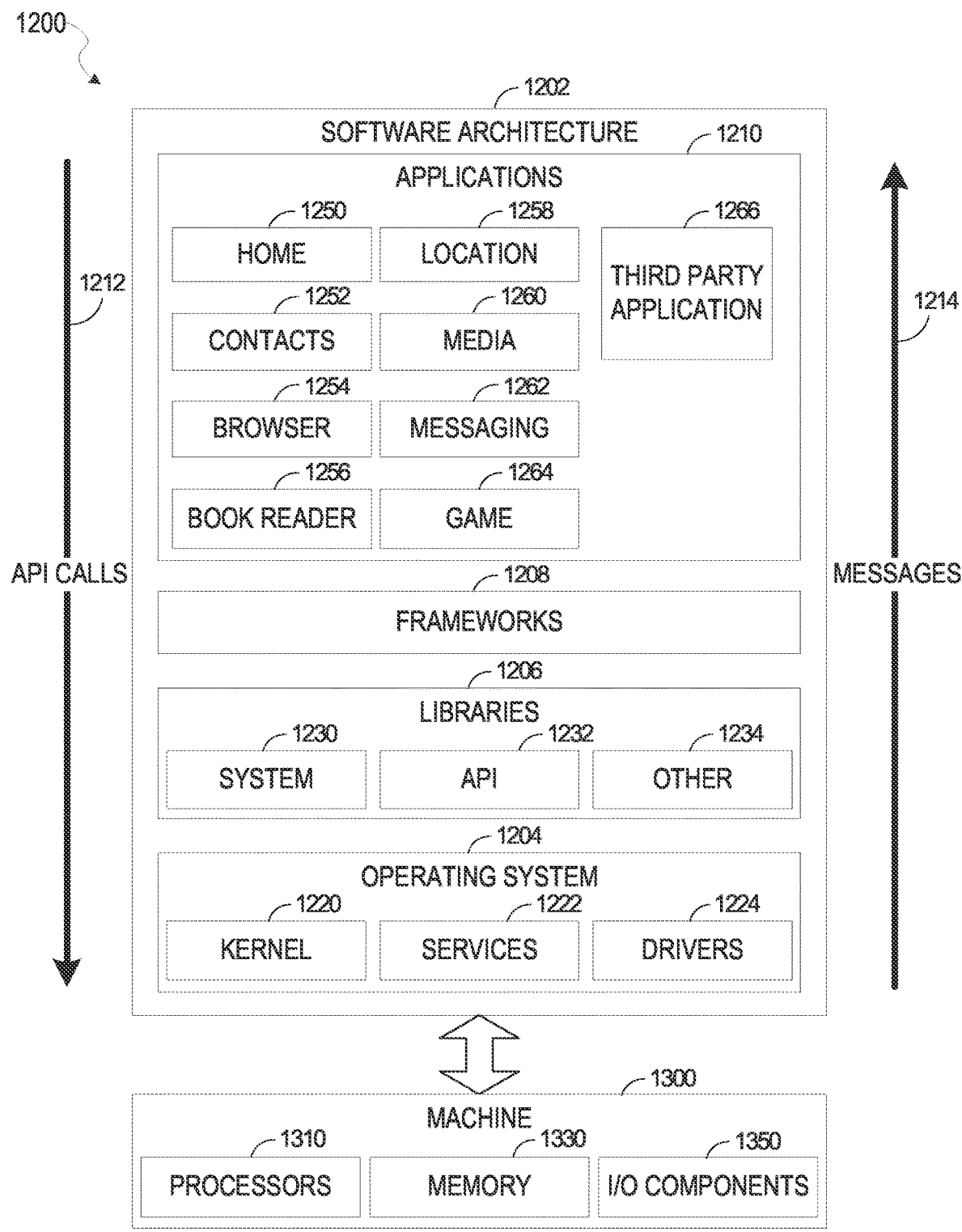
FIG. 12 is a block diagram illustrating a representative software architecture, which may be used in conjunction with various hardware architectures herein described.

FIG. 12 is a block diagram 1200 illustrating an architecture of software 1202, which can be installed on any one or more of the devices described above. FIG. 12 is merely a non-limiting example of a software architecture, and it will be appreciated that many other architectures can be implemented to facilitate the functionality described herein. In various embodiments, the software 1202 is implemented by hardware such as a machine 1300 of FIG. 13 that includes processors 1310, memory 1330, and I/O components 1350. In this example architecture, the software 1202 can be conceptualized as a stack of layers where each layer may provide a particular functionality. For example, the software 1202 includes layers such as an operating system 1204, libraries 1206, frameworks 1208, and applications 1210. Operationally, the applications 1210 invoke application programming interface (API) calls 1212 through the software stack and receive messages 1214 in response to the API calls 1212, consistent with some embodiments.

In various implementations, the operating system 1204 manages hardware resources and provides common services. The operating system 1204 includes, for example, a kernel 1220, services 1222, and drivers 1224. The kernel 1220 acts as an abstraction layer between the hardware and the other software layers, consistent with some embodiments. For example, the kernel 1220 provides memory management, processor management (e.g., scheduling), component management, networking, and security settings, among other functionality. The services 1222 can provide other common services for the other software layers. The drivers 1224 are responsible for controlling or interfacing with the underlying hardware, according to some embodiments. For instance, the drivers 1224 can include display drivers, camera drivers, BLUETOOTH® or BLUETOOTH® Low Energy drivers, flash memory drivers, serial communication drivers (e.g., Universal Serial. Bus (USB) drivers), WI-FI® drivers, audio drivers, power management drivers, and so forth.

In some embodiments, the libraries 1206 provide a low-level common infrastructure utilized by the applications 1210. The libraries 1206 can include system libraries 1230 (e.g., C standard library) that can provide functions such as memory allocation functions, string manipulation functions, mathematic functions, and the like. In addition, the libraries 1206 can include API libraries 1232 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. The libraries 1206 can also include a wide variety of other libraries 1234 to provide many other APIs to the applications 1210.

The frameworks 1208 provide a high-level common infrastructure that can be utilized by the applications 1210, according to some embodiments. For example, the frameworks 1208 provide various graphic user interface (GUI) functions, high-level resource management, high-level location services, and so forth. The frameworks 1208 can provide a broad spectrum of other APIs that can be utilized by the applications 1210, some of which may be specific to a particular operating system or platform.

In an example embodiment, the applications 1210 include a home application 1250, a contacts application 1252, a browser application 1254, a book reader application 1256, a location application 1258, a media application 1260, a messaging application 1262, a game application 1264, and a broad assortment of other applications such as a third-party application 1266. According to some embodiments, the applications 1210 are programs that execute functions defined in the programs. Various programming languages can be employed to create one or more of the applications 1210, structured in a variety of manners, such as object-oriented programming languages (e.g., Objective-C, Java, or C++) or procedural programming languages (e.g., C or assembly language). In a specific example, the third-party application 1266 (e.g., an application developed using the ANDROID™ or IOS™ software development kit (SDK) by an entity other than the vendor of the particular platform) may be mobile software running on a mobile operating system such as IOS™, ANDROID™ WINDOWS® Phone, or another mobile operating system. In this example, the third-party application 1266 can invoke the API calls 1212 provided by the operating system 1204 to facilitate functionality described herein.

Figure 13:
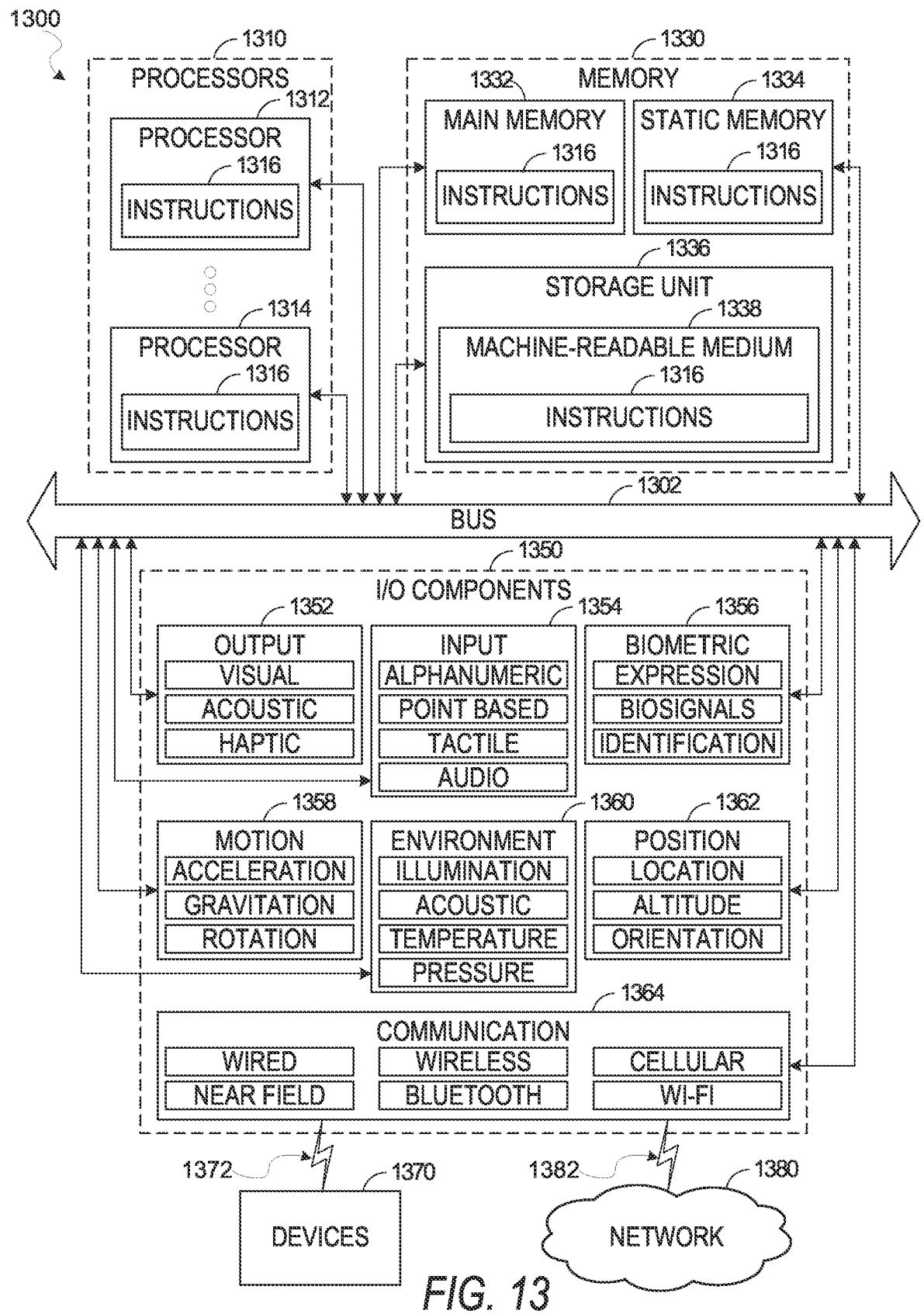
FIG. 13 is a block diagram illustrating components of a machine, according to some example embodiments, able to read instructions from a machine-readable medium (e.g., a machine-readable storage medium) and perform any one or more of the methodologies discussed herein.

FIG. 13 illustrates a diagrammatic representation of a machine 1300 in the form of a computer system within which a set of instructions may be executed for causing the machine to perform any one or more of the methodologies discussed herein, according to an example embodiment. Specifically, FIG. 13 shows a diagrammatic representation of the machine 1300 in the example form of a computer system, within which instructions 1316 (e.g., software, a program, an application, an applet, an app, or other executable code) for causing the machine 1300 to perform any one or more of the methodologies discussed herein may be executed. The instructions 1316 transform the general, non-programmed machine 1300 into a particular machine 1300 programmed to carry out the described and illustrated functions in the manner described. In alternative embodiments, the machine 1300 operates as a standalone device or may be coupled. (e.g., networked) to other machines. In a networked deployment, the machine 1300 may operate in the capacity of a server machine or a client machine in a server-client network environment, or as a peer machine in a peer-to-peer (or distributed) network environment. The machine 1300 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1316, sequentially or otherwise, that specify actions to be taken by the machine 1300. Further, while only a single machine 1300 is illustrate the term "machine" shall also be taken to include a collection of machines 1300 that individually or jointly execute the instructions 1316 to perform any one or more of the methodologies discussed herein.

The machine 1300 may include processors 1310, memory 1330, and I/O components 1350, which may be configured to communicate with each other such as via a bus 1302. In an example embodiment, the processors 1310 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, a processor 1312 and a processor 1314 that may execute the instructions 1316. The term "processor" is intended to include multi-core processors that may comprise two or more independent processors (sometimes referred to as "cores") that may execute instructions contemporaneously. Although FIG. 13 shows multiple processors 1310, the machine 1300 may include a single processor with a single core, a single processor with multiple cores (e.g., a multi-core processor), multiple processors with a single core, multiple processors with multiples cores, or any combination thereof.

The memory 1330 may include a main memory 1332, a static memory 1334, and a storage unit 1336, both accessible to the processors 1310 such as via the bus 1302. The main memory 1330, the static memory 1334, and storage unit 1336 store the instructions 1316 embodying any one or more of the methodologies or functions described herein. The instructions 1316 may also reside, completely or partially, within the main memory 1332, within the static memory 1334, within the storage unit 1336, within at least one of the processors 1310 (e.g., within the processor's cache memory), or any suitable combination thereof, during execution thereof by the machine 1300.

The I/O components 1350 may include a wide variety of components to receive input, provide output, produce output, transmit information, exchange information, capture measurements, and so on. The specific I/O components 1350 that are included in a particular machine will depend on the type of machine. For example, portable machines such as mobile phones will likely include a touch input device or other such input mechanisms, while a headless server machine will likely not include such a touch input device. It will be appreciated that the I/O components 1350 may include many other components that are not shown in FIG. 13. The I/O components 1350 are grouped according to functionality merely for simplifying the following discussion and the grouping is in no way limiting. In various example embodiments, the I/O components 1350 may include output components 1352 and input components 1354. The output components 1352 may include visual components (e.g., a display such as a plasma display panel (MP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 1354 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 1350 may include biometric components 1356, motion components 1358, environmental components 1360, or position components 1362, among a wide array of other components. For example, the biometric components 1356 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 1358 may include acceleration sensor components (e.g., accelerometer), gravitation sensor components, rotation sensor components (e.g., gyroscope), and so forth. The environmental components 1360 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1362 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1350 may include communication components 1364 operable to couple the machine 1300 to a network 1380 or devices 1370 via a coupling 1382 and a coupling 1372, respectively. For example, the communication components 1364 may include a network interface component or another suitable device to interface with the network 1380. In further examples, the communication components 1364 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1370 may be another machine or any of a wide variety of peripheral devices (e.g., a peripheral device coupled via a USB).

Moreover, the communication components 1364 may detect identifiers or include components operable to detect identifiers. For example, the communication components 1364 may include Radio Frequency Identification (MD) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 1364, such as location via Internet Protocol (IP) geolocation, location via Wi-Fi® signal triangulation, location via detecting an NFC beacon signal that may indicate a particular location, and so forth.

The various memories (i.e., 1330, 1332, 1334, and/or memory of the processor(s) 1310) and/or storage unit 1336 may store one or more sets of instructions and data structures (e.g., software) embodying or utilized by any one or more of the methodologies or functions described herein. These instructions (e.g., the instructions 1316), when executed by processor(s) 1310, cause various operations to implement the disclosed embodiments.

As used herein, the terms "machine-storage medium," "device-storage medium," "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

In various example embodiments, one or more portions of the network 1380 may be an ad hoc network, an intranet, an extranet, a VPN, a LAN, a WLAN, a WAN, a WWAN, a MAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 1380 or a portion of the network 1380 may include a wireless or cellular network, and the coupling 1382 may be a Code Division Multiple Access (CDMA) connection, a Global System for Mobile communications (GSM) connection, or another type of cellular or wireless coupling. In this example, the coupling 1382 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 1316 may be transmitted or received over the network 1380 using a transmission medium via a network interface device (e.g., a network interface component included in the communication components 1364) and utilizing any one of a number of well-known transfer protocols (e.g., hypertext transfer protocol (HTTP)). Similarly, the instructions 1316 may be transmitted or received using a transmission medium via the coupling 1372 (e.g., a peer-to-peer coupling) to the devices 1370. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 1316 for execution by the machine 1300, and includes digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a matter as to encode information in the signal.

The terms "machine-readable medium," "computer-readable medium" and "device-readable medium" mean the same thing and may be used interchangeably in this disclosure. The terms are defined to include both machine-storage media and transmission media. Thus, the terms include both storage devices/media and carrier waves/modulated data signals.

What is claimed is:

1. A method comprising:
   generating, by a client device, an image sequence of a physical environment using an image sensor of the client device;
   generating, on the client device, a virtual plane that coincides with a physical surface of the physical environment;
   projecting a virtual item onto the physical surface by anchoring a side of the virtual item on the generated virtual plane in the image sequence;
   detecting movement using one or more inertial sensors of the client device; and
   in response to the detected movement, moving the projection of the virtual item on the physical surface of the image sequence by sliding the virtual item along the virtual plane while the side of the virtual item is anchored to the virtual plane.

2. The method of claim 1, wherein the projection is moved to a new position, and wherein the method further comprises:
   receiving a render instruction after moving the projection in response to the detected movement; and
   in response to receiving the render instruction, rendering using the virtual item to generate a virtual item render having realistic surface texture and lighting at the new position in the image sequence.

3. The method of claim 1, wherein the virtual item is a virtual panel that is smaller than the virtual plane.

4. The method of claim 1, wherein generating the virtual plane comprises:
   receiving one or more point placements on a virtual ground detected in the image sequence, wherein the virtual plane is generated to coincide with the one or more point placements.

5. The method of claim 4, wherein generating the virtual plane to coincide with the one or more point placements includes generating the virtual plane at the point placements and setting the virtual plane as orthogonal to the virtual ground detected in the image sequence.

6. The method of claim 1, wherein the virtual plane is transparent, and the virtual item is visible in the image sequence.

7. The method of claim 6, wherein the virtual item is a virtual door that is anchored to a bottom side of the virtual plane such that updating the projection of the virtual item simulates the virtual door sliding along the bottom side of the physical surface as viewed through the image sequence on the client device.

8. The method of claim 7, wherein the bottom side of the virtual plane is an edge of the virtual plane, and a virtual door side of the virtual door is anchored to the edge of the virtual plane so as to slide along the edge of the virtual plane.

9. The method of claim 7, wherein the side of a virtual plane is defined as an intersection of the virtual plane with a virtual floor generated by the client device.

10. The method of claim 9, the method further comprising:

detecting a physical ground of the physical environment depicted in the image sequence by detecting a plurality of image features of the physical ground;
generating the virtual floor to correspond to the physical ground;
determining an intersection of the virtual floor and the virtual plane; and
anchoring the virtual door to the intersection of the virtual floor and the virtual plane.

11. The method of claim 1, wherein the virtual item is a mesh of a model of a vertical virtual item.

12. The method of claim 1, wherein the virtual item is a simplified geometric shape of a vertical virtual item.

13. The method of claim 1, wherein the virtual item is a collection of vertices connected by lines that outline a shape of a vertical virtual item.

14. A system comprising:
one or more processors of a machine;
an image sensor;
one or more inertial sensors;
a memory storing instructions that, when executed by the one or more processors, cause the machine to perform operations comprising:
generating an image sequence of a physical environment using the image sensor;
generating a virtual plane that coincides with a physical surface of the physical environment;
projecting a virtual item onto the physical surface by anchoring a side of the virtual item on the generated virtual plane in the image sequence;
detecting movement using one or more inertial sensors; and
in response to the detected movement, moving the projection of the virtual item on the physical surface of the image sequence by sliding the virtual item along the virtual plane while the side of the virtual item is anchored to the virtual plane.

15. The system of claim 14, wherein the projection is moved to a new position, and wherein the operations further comprise:
receiving a render instruction after moving the projection in response to the detected movement; and
in response to receiving the render instruction, rendering using the virtual item to generate a virtual item render having realistic surface texture and lighting at the new position in the image sequence.

16. The system of claim 14, wherein the virtual item is a virtual panel that is smaller than the virtual plane.

17. The system of claim 14, wherein generating the virtual plane comprises:
receiving one or more point placements on a virtual ground detected in the image sequence, wherein the virtual plane generated to coincide with the one or more point placements.

18. The system of claim 17, wherein generating the virtual plane to coincide with the one or more point placements includes generating the virtual plane at the point placements and setting the virtual plane as orthogonal to the virtual ground detected in the image sequence.

19. The system of claim 14, wherein the virtual plane is transparent, and the virtual item is visible in the image sequence.

20. A non-transitory machine-readable storage device embodying instructions that, when executed by a machine, cause the machine to perform operations comprising:
generating an image sequence of a physical environment using an image sensor;
generating a virtual plane that coincides with a physical surface of the physical environment;
projecting a virtual item onto the physical surface by anchoring a side of the virtual item on the generated virtual plane in the image sequence;
detecting movement using one or more inertial sensors; and
in response to the detected movement, moving the projection of the virtual item on the physical surface of the image sequence by sliding the virtual item along the virtual plane while the side of the virtual item is anchored to the virtual plane.

* * * * *